(12) United States Patent
Lee (10) Patent No.: US 6,660,580 B2
(45) Date of Patent: Dec. 9, 2003

(54) CAPACITOR OF AN INTEGRATED CIRCUIT DEVICE AND METHOD OF MANUFACTURING THE SAME

(75) Inventor: Kong-Soo Lee, Gyeonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/141,881

(22) Filed: May 10, 2002

(65) Prior Publication Data

US 2002/0167037 A1 Nov. 14, 2002

(30) Foreign Application Priority Data

May 10, 2001 (KR) ........................................ 2001-25553

(51) Int. Cl.$^7$ ......................................... H01L 21/8242
(52) U.S. Cl. ..................... 438/240; 438/244; 438/253; 438/387; 438/396
(58) Field of Search ............................. 438/239, 240, 438/244, 253, 387, 396

(56) References Cited

U.S. PATENT DOCUMENTS

| 5,330,931 | A | * | 7/1994 | Emesh et al. ............... 438/3 |
| 5,416,042 | A | * | 5/1995 | Beach et al. ............... 438/396 |
| 6,184,074 | B1 | * | 2/2001 | Crenshaw et al. ........... 438/238 |
| 6,455,424 | B1 | * | 9/2002 | McTeer et al. .............. 438/675 |
| 6,461,911 | B2 | * | 10/2002 | Ahn et al. ................... 438/253 |
| 6,509,601 | B1 | * | 1/2003 | Lee et al. ................... 257/310 |
| 6,579,755 | B2 | * | 6/2003 | Kim et al. ................... 438/240 |
| 2002/0142488 | A1 | * | 10/2002 | Hong ............................. 438/3 |

* cited by examiner

*Primary Examiner*—Eddie Lee
*Assistant Examiner*—N. Drew Richards
(74) *Attorney, Agent, or Firm*—Lee & Sterba, P.C.

(57) ABSTRACT

The present invention relates to a capacitor of a semiconductor memory cell and a method of manufacturing the same wherein a capacitor includes a first insulation layer having a buried contact hole, formed on a semiconductor substrate, and a buried contact plug filling a portion of the buried contact hole. A diffusion barrier spacer is formed on an inner surface of the buried contact hole above the buried contact plug. A second insulation layer is formed, having a through hole larger than the buried contact hole, for exposing the diffusion barrier spacer and a top surface of the contact plug. A barrier layer is formed on the through hole and a lower electrode is formed on the barrier layer. A dielectric layer is formed on the lower electrode and an upper surface of the second insulation layer and an upper electrode is formed on the dielectric layer.

7 Claims, 13 Drawing Sheets

CAPACITOR OF AN INTEGRATED CIRCUIT DEVICE AND METHOD OF MANUFACTURING THE SAME

BACKGROUND OF THE INVENTION

1. Field of the Invention

The present invention relates to a capacitor of an integrated circuit device and a method of manufacturing the same. More particularly, the present invention relates to a metal-insulator-metal capacitor of a semiconductor memory cell such as a dynamic random access memory cell, and a method of manufacturing the same, in which oxidation of a contact plug during deposition of a dielectric material having a high dielectric constant to form a dielectric layer is prevented.

2. Description of the Related Art

As a degree of integration of a semiconductor memory device, such as a DRAM cell increases, it becomes more difficult to obtain a sufficient capacitance due to a resulting decrease in size of individual memory cells. Recently, various efforts have been made to obtain a sufficient capacitance from a limited cell area.

There are typically two methods to increase a cell capacitance. A first method is to use a material having a high dielectric constant as a dielectric layer of the capacitor. A second method is to increase an effective area of the cell using a hemisphere silicon grain (HSG) growing method.

As for the material having a high dielectric constant, a metal oxide layer comprised of $Ta_2O_5$, TaOxNy, $Al_2O_3$, (Ba, Sr)$TiO_3$[BST], $SrTiO_3$[ST], Pb(Zi, Ti)$O_3$[PLZT], SBT, or like, is used instead of a silicon oxide layer or a nitride layer.

Even though the dielectric layer is formed by depositing $Ta_2O_5$ on a semiconductor substrate by a chemical vapor deposition (CVD) method, an oxygen vacancy where an oxygen bonding is absent is inevitably present in the dielectric layer. Therefore, a UV $O_3$ treatment is typically performed to supplement the oxygen vacancy during the CVD process. Furthermore, the dielectric layer is crystallized by means of a heat treatment in an oxygen atmosphere to increase a dielectric constant after performing the deposition.

A storage node is oxidized through a reaction with oxygen when the dielectric layer comprised of $Ta_2O_5$ is subjected to the heat treatment in an oxygen atmosphere during or after the deposition thereof. Formation of an oxide layer through this oxidation process increases the thickness of the dielectric layer of the capacitor, thereby decreasing the dielectric constant, which results in a reduction in capacitance of the capacitor of the semiconductor memory cell.

Since the use of an existing polysilicon electrode is limited, a novel material for formation of an electrode and a novel structure of the electrode are required. As platinum (Pt) has a high reactivity to silicon, when platinum is used for formation of the electrode, a barrier layer is needed to insulate the platinum electrode from a contact plug comprised of polysilicon. Typically, titanium nitride or tantalum nitride is used as the barrier layer.

However, during or after deposition of a layer to form a lower electrode or a dielectric layer, a heat treatment is performed in an oxygen atmosphere to crystallize the lower electrode layer or the dielectric layer. During this heat treatment, oxygen diffuses along a boundary surface between a barrier layer and an insulation layer to reach a contact plug, resulting in oxidation of a surface portion of the contact plug. The oxidation of the contact plug decreases the capacitance of the capacitor of the semiconductor memory cell.

Hereinafter, a conventional capacitor of an integrated circuit device will be described.

Figure 1:
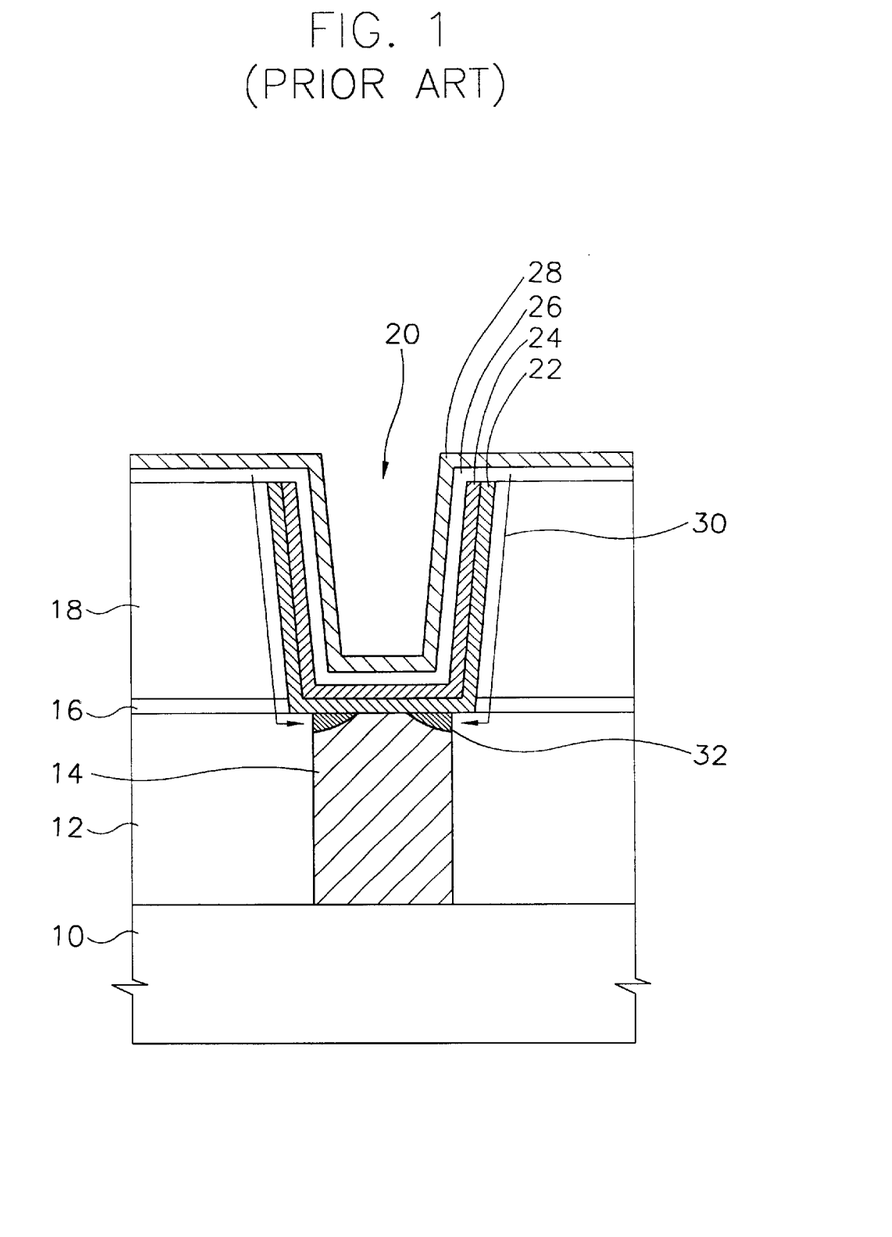
FIG. 1 illustrates a sectional view for showing a conventional concave type of a metal-insulator-metal capacitor of an integrated circuit device according to the prior art.
Figure 2:
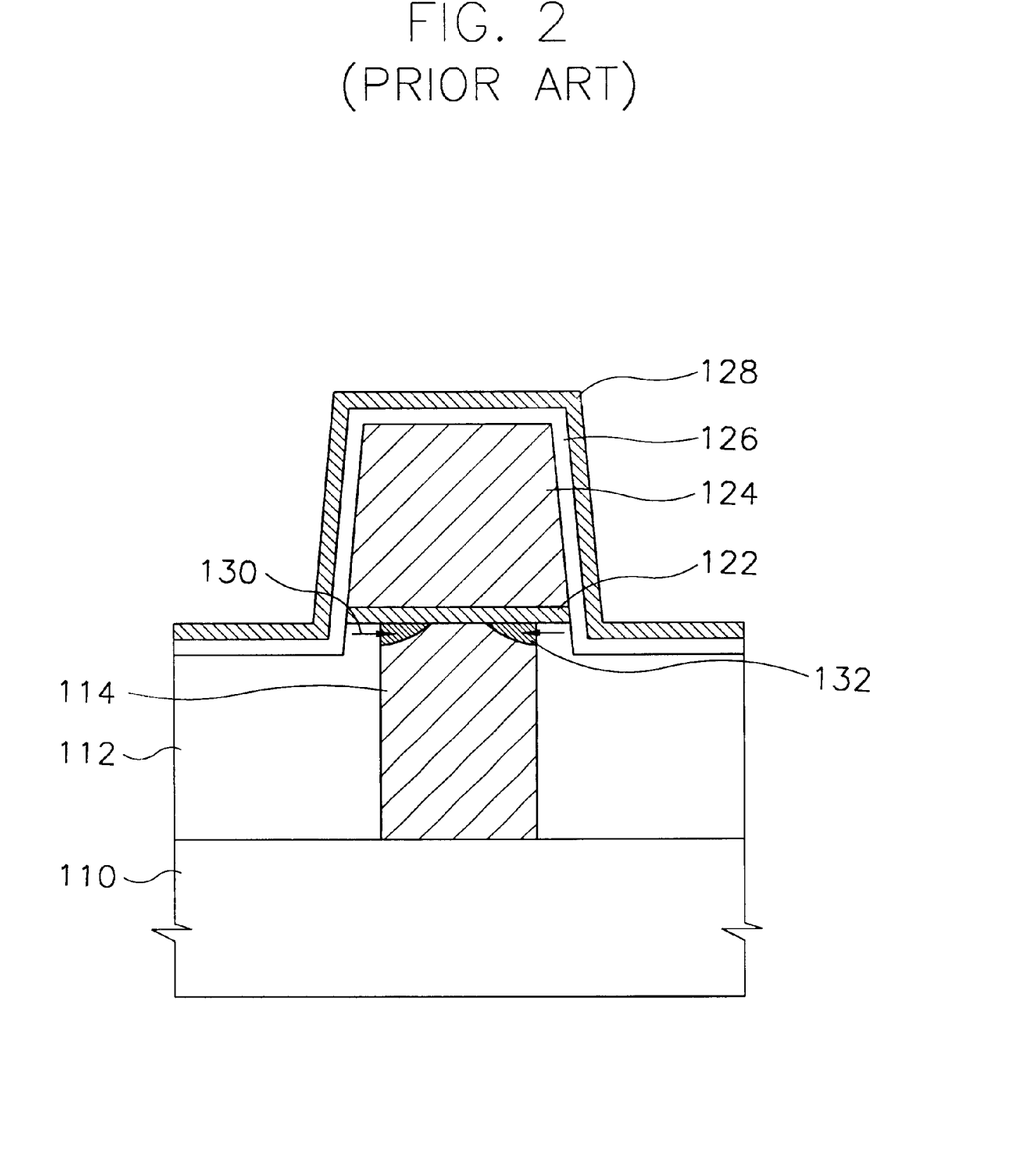
FIG. 2 illustrates a sectional view for showing a conventional convex type of a metal-insulator-metal capacitor of an integrated circuit device according to the prior art.

FIG. 1 illustrates a sectional view showing a conventional concave type of a metal-insulator-metal capacitor of an integrated circuit device. FIG. 2 illustrates a sectional view showing a conventional convex type of a metal-insulator-metal capacitor of an integrated circuit device.

The concave type of the metal-insulator-metal capacitor of the integrated circuit device is formed in such a manner that a first insulation layer 12 is formed on a semiconductor substrate 10 and a contact plug 14 is formed in the first insulation layer 12. A diffusion barrier layer 16 comprised of a nitride material and a second insulation layer 18 are sequentially deposited on the contact plug 14. A through hole 20 is formed in the second insulation layer 18 and through the diffusion barrier layer 16. A barrier layer 22, a lower electrode layer 24, a dielectric layer 26 and an upper electrode layer 28 are subsequently formed in the through hole along a surface profile of the through hole 20.

The convex type of the metal-insulator-metal capacitor of the integrated circuit device is formed in such a manner that a first insulation layer 112 is formed on a semiconductor substrate 110 and a contact plug 114 is formed in the first insulation layer 112. A barrier layer 122 and a thick lower electrode layer 124 are integrated and subsequently formed on the contact plug 114.

Then, the barrier layer 122 and the lower electrode layer 124 are patterned by a photolithography so that each node is defined. Subsequently, a dielectric layer 126 and an upper electrode layer 128 are sequentially stacked on the lower electrode 124.

In FIGS. 1 and 2, when the dielectric layers 26 and 126 are crystallized under an oxygen atmosphere, oxygen diffuses toward an upper portion of the contact plugs 14 and 114 along oxygen diffusion pathways 30 and 130 on a boundary surface between the barrier layers 22 and 122 and the insulation layers 12 and 112. As a result, the contact plugs 14 and 114 formed of polysilicon make contact with oxygen at the upper portion thereof to be oxidized and converted into silicon oxide layers 32 and 132, which act as an insulator. This increases a contact resistance between the lower electrode and the plug of the capacitor thereby decreasing reliability of the cell capacitor.

From FIGS. 1 and 2, it may be noted that since the convex type of the capacitor of the integrated circuit device has a shorter oxygen diffusion pathway 130 than the oxygen diffusion pathway 30 of the concave type of the capacitor of the integrated circuit device, the convex type of the capacitor of the integrated circuit device has a weaker structure. Accordingly, the plug of the convex type capacitor is more easily oxidized due to the diffusion of oxygen than the concave type capacitor of the integrated circuit device.

Furthermore, in the concave type metal-insulator-metal capacitor, the nitride layer 16 is disposed between the first insulation layer 12 and the second insulation layer 18 to prevent the diffusion of oxygen.

However, although the nitride layer acts to substantially reduce the oxidation of the upper portion of the plug, the nitride layer cannot completely prevent oxidation of the plug.

That is, it is difficult to prevent oxidation of the plug because the nitride layer as the diffusion barrier layer is not sufficiently dense, and a distance between the nitride layer and the upper portion of the plug is very short.

SUMMARY OF THE INVENTION

In order to solve the aforementioned problems, it is a feature of an embodiment of the present invention to provide a capacitor of an integrated circuit device capable of preventing oxidation of a contact plug, in which a diffusion barrier layer is formed in a pathway through which oxygen diffuses.

It is another feature of an embodiment of the present invention to provide an advantageous method of manufacturing the capacitor of an integrated circuit device described above.

In order to provide the first feature of the present invention, a capacitor of an integrated circuit device according to a first embodiment of the present invention is provided. A first insulation layer is formed on a semiconductor substrate, and a buried contact hole is formed therein. A buried contact plug is formed in the buried contact hole for filling a portion of the buried contact hole to a predetermined height. A diffusion barrier spacer is formed on the buried contact plug and on an inner side surface of an upper portion of the buried contact hole. On the first insulation layer, a second insulation layer is formed. The second insulation layer has a through hole having a diameter larger than that of the buried contact hole. Through the through hole, the diffusion barrier spacer and a top surface of the contact plug are exposed. A barrier layer is uniformly formed on an inner side surface of the through hole to a predetermined thickness and a lower electrode is uniformly formed on the barrier layer to a predetermined thickness. A dielectric layer is uniformly formed on the lower electrode and an upper surface of the second insulation layer to a predetermined thickness. On the dielectric layer, an upper electrode is uniformly formed to a predetermined thickness.

In the capacitor of the first embodiment of the present invention, the diffusion barrier spacer is preferably formed of $Al_2O_3$, which is denser than a nitride layer and preferably has a thickness of about 50 Å to 500 Å.

According to the first embodiment of the present invention, the upper electrode and the lower electrode are preferably comprised of any one selected from the group consisting of Pt, Ru, Ir, RuOx, IrOx, and a mixture thereof. The barrier layer is preferably comprised of TiN, TiSiN or TaN. Also, the dielectric layer is preferably comprised of at least one selected from the group consisting of $Ta_2O_5$, TaOxNy, $Al_2O_3$, (Ba, Sr)$TiO_3$[BST], $SrTiO_3$[ST], Pb(Zi, Ti)$O_3$[PLZT], SBT and a mixture thereof.

In particular, the capacitor of the integrated circuit device according to the first embodiment of the present invention may further include a diffusion barrier layer, preferably comprised of $Al_2O_3$, between the first insulation layer and the second insulation layer. Preferably, the diffusion barrier layer has a thickness of about 50 Å to 500 Å.

In order to manufacture the capacitor according to the first embodiment of the present invention, a first method of manufacturing a capacitor of an integrated circuit device is provided as follows. First, a first insulation layer is formed on a semiconductor substrate. Then, a buried contact hole is formed in the first insulation layer. A portion of the buried contact hole is filled to a predetermined height to form a buried contact plug. A diffusion barrier layer having a predetermined thickness is uniformly formed on an upper surface of the first insulation layer, an inner side surface of an upper portion of the buried contact hole above the buried contact plug, and a top surface of the buried contact plug. An etching stop layer and a second insulation layer is formed on the diffusion barrier layer.

Then, the second insulation layer and the diffusion barrier layer are etched to form a through hole so that the top surface of the buried contact plug is exposed and a diffusion barrier spacer is formed on the inner side surface of the upper portion of the buried contact hole. The through hole has a larger diameter than that of the buried contact hole.

Subsequently, a barrier layer is uniformly formed on the top surface of the contact plug to a predetermined thickness. A lower electrode is uniformly formed on the barrier layer to a predetermined thickness and a dielectric layer is uniformly formed on the lower electrode and the upper surface of the second insulation layer to a predetermined thickness. Then, the dielectric layer is heat treated in an oxygen atmosphere in order to crystallize the dielectric layer. Next, an upper electrode is uniformly formed on the dielectric layer to a predetermined thickness.

Alternatively, a second method of manufacturing the capacitor according to the first embodiment of the present invention is provided as follows.

A first insulation layer is formed on a semiconductor substrate and then, a buried contact hole is formed in the first insulation layer. A buried contact plug is formed in the buried contact hole to fill a portion of the buried contact hole. Then, a diffusion barrier layer is uniformly formed on the first insulation layer, on the buried contact plug and on an inner side surface of an upper portion of the buried contact hole along a surface profile thereof, to a predetermined thickness. A second insulation layer is formed on the diffusion barrier layer. Then, the second insulation layer and the diffusion barrier layer are etched to form a through hole to expose a top surface of the buried contact plug and a diffusion barrier spacer on an inner side surface of the upper portion of the buried contact hole. The through hole has a larger diameter than that of the buried contact hole. After that, a barrier layer is uniformly formed to a predetermined thickness on a bottom and side surface of the through hole along a surface profile of the through hole. A lower electrode is uniformly formed on the barrier layer to a predetermined thickness and a dielectric layer is uniformly formed on the lower electrode and an upper surface of the second insulation layer to a predetermined thickness. Then, the dielectric layer is heat treated in an oxygen atmosphere to crystallize the dielectric layer. Next, an upper electrode is uniformly formed on the dielectric layer to a predetermined thickness.

Another feature of the present invention may be provided by a capacitor of an integrated circuit device according to a third embodiment of the present invention. The capacitor includes an insulation layer which is formed in a semiconductor substrate, the insulation layer having a buried contact hole formed therein and a buried contact plug filling a portion of the buried contact hole to a predetermined height. A diffusion barrier spacer is formed on the buried contact plug and on an inner side surface of an upper portion of the buried contact hole above the buried contact plug. A barrier layer is uniformly formed to a predetermined thickness on an upper surface of the insulation layer, the diffusion barrier spacer and the buried contact plug. Preferably, the diffusion barrier spacer is formed of $Al_2O_3$ and has a thickness of 50 Å to 500 Å. A lower electrode is uniformly formed to a predetermined thickness on the barrier layer and a dielectric layer is uniformly formed on the lower electrode. Further, an upper electrode is uniformly formed on the dielectric layer to a predetermined thickness.

According to another aspect of the present invention, a method of manufacturing a capacitor of an integrated circuit according to the third embodiment of the present invention is provided as follows. An insulation layer is formed on a semiconductor substrate and a buried contact hole is formed in the insulation layer. Then, a buried contact plug is formed to fill a portion of the buried contact hole to a predetermined height. A diffusion barrier spacer is formed on an upper inner side surface of the buried contact hole. Then, a barrier layer is uniformly formed to a predetermined thickness on an upper surface of the insulation layer, a diffusion barrier spacer and a top surface of the contact plug. A lower electrode is uniformly formed on the barrier layer to a predetermined thickness and a dielectric layer is uniformly formed on the lower electrode to a predetermined thickness. Also, an upper electrode is uniformly formed on the dielectric layer to a predetermined thickness.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Korean Patent Application No. 2001-25553, filed on May 10, 2001, and entitled: "Capacitor of an Integrated Circuit Device and Method of Manufacturing the Same" is incorporated by reference herein in its entirety.

Hereinafter, the embodiments of the present invention will be described in detail with reference to the accompanying drawings.

In the present invention, a part of the plug is removed so that the distance between the diffusion barrier layer and the upper portion of the plug is increased to the extent of a height of the portion removed from the plug. Also, a diffusion barrier spacer, preferably comprised of $Al_2O_3$, that is denser than a nitride material is formed on an inner side surface of a buried contact hole in which the portion of the plug is removed. As a result, oxidation of the plug by the diffusion of oxygen may be completely prevented during implementation of subsequent processes.

Figure 3:
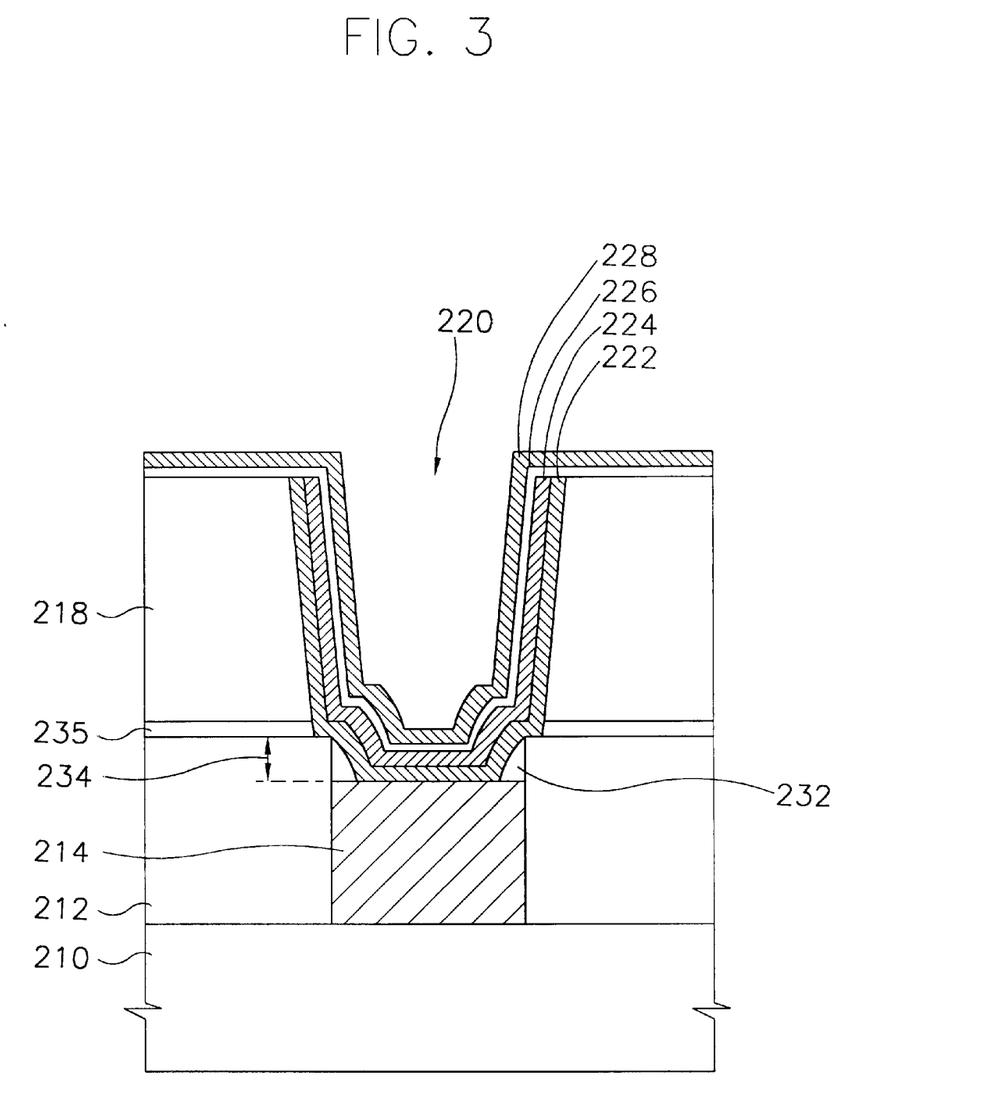
FIG. 3 illustrates a sectional view for showing a concave type of a metal-insulator-metal capacitor of an integrated circuit device according to a first embodiment of the present invention.
Figure 4:
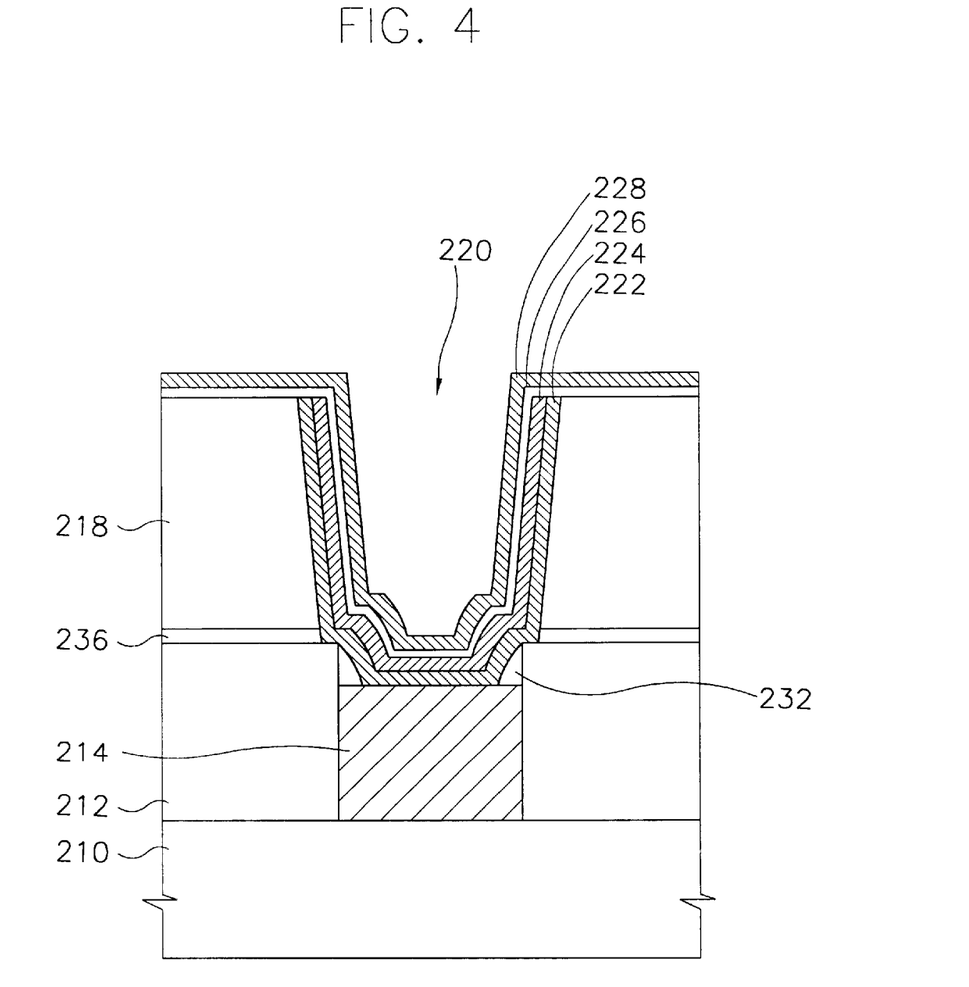
FIG. 4 illustrates a sectional view for showing a concave type of a metal-insulator-metal capacitor of an integrated circuit device according to a second embodiment of the present invention.

FIG. 3 illustrates a sectional view showing a concave type of a metal-insulator-metal capacitor of an integrated circuit device according to the first embodiment of the present invention. FIG. 4 illustrates a sectional view showing a concave type of a metal-insulator-metal capacitor of an integrated circuit device according to the second embodiment of the present invention.

In the concave type of the metal-insulator-metal capacitor of the integrated circuit device according to the first embodiment of the present invention as shown in FIG. 3, polysilicon is partially filled in a buried contact hole that is formed in a first insulation layer 212 on a semiconductor substrate 210. The polysilicon is formed so that a space having a predetermined depth 234 is not filled, and the polysilicon forms a buried contact plug 214. A diffusion barrier spacer 232, preferably comprised of $Al_2O_3$, is formed on a top surface of the buried contact plug 214 and on an inner side surface of an upper portion of a buried contact hole above the buried contact plug 214. A nitride layer 235 as an etching stop layer is formed through a deposition method on the first insulation layer 212. A second insulation layer 218 is formed on the nitride layer 235. Then, a through hole 220 is formed in the second insulation layer 218. A barrier layer 222, a lower electrode layer 224, a dielectric layer 226 and an upper electrode layer 228 are sequentially deposited along a surface profile of the through hole 220.

The diffusion barrier spacer 232, which is preferably formed of $Al_2O_3$, is denser than the nitride material. As the diffusion barrier spacer 232 is formed in an oxygen diffusion pathway, and a distance between the buried contact plug 214 and the nitride layer 235 is increased to the extent of the height of the diffusion barrier spacer 232, the diffusion of oxygen over the top surface of the buried contact plug 214 may be almost completely prevented.

The concave type of the metal-insulator-metal capacitor of the integrated circuit device according to the second embodiment of the present invention is shown in FIG. 4. It is different from the capacitor of the integrated circuit device of the first embodiment of the present invention in that a diffusion barrier layer 236, preferably comprised of $Al_2O_3$, instead of the nitride layer 235, is disposed between the first insulation layer 212 and the second insulation layer 218.

Figure 5:
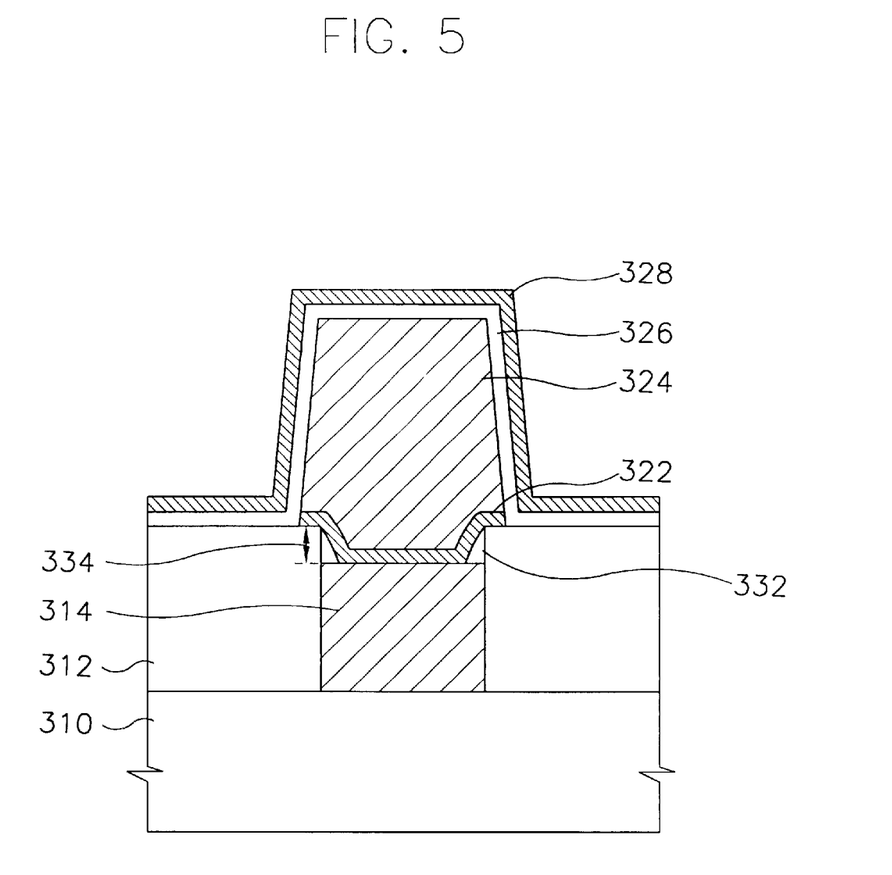
FIG. 5 illustrates a sectional view for showing a convex type of a metal-insulator-metal capacitor of an integrated circuit device according to a third embodiment of the present invention.

FIG. 5 illustrates a sectional view showing a convex type of a metal-insulator-metal capacitor of an integrated circuit device according to the third embodiment of the present invention. In the convex type of the metal-insulator-metal capacitor of the integrated circuit device according to the third embodiment of the present invention, polysilicon is partially filled in a buried contact hole that is formed in an insulation layer 312 on a semiconductor substrate 310. The polysilicon forms a buried contact plug 314. A space having a predetermined depth 334 remains unfilled in the contact hole. A diffusion barrier spacer 332, preferably comprised of $Al_2O_3$, is formed on a top surface of the buried contact plug 314 and on an inner side surface of an upper portion of the buried contact hole. A barrier layer 322 and a thick lower electrode layer 324 are deposited on the buried contact plug 314. Then, the barrier layer 322 and the lower electrode layer 324 are patterned through a photolithography process so that the barrier layer 322 and the lower electrode layer 324 are divided into a node unit. Then, a dielectric layer 326 and an upper electrode layer 328 are sequentially deposited along a surface profile of the patterned structure.

The diffusion barrier spacer 332, which is preferably formed of $Al_2O_3$, is denser than a nitride material. Also, the diffusion barrier spacer 332 is formed in an oxygen diffusion pathway on a boundary surface of the barrier layer 322 and the insulation layer 312. For these reasons, and because a distance between the buried contact plug 314 and the boundary surface is increased to the extent of the height 334 of the diffusion barrier spacer 332, diffusion of oxygen over the top surface of the plug 314 is essentially prevented.

A method of manufacturing the concave type of the metal-insulator-metal capacitor of an integrated circuit device according to a second embodiment of the present invention will be described with reference to FIGS. 6 to 11.

Initially, a dynamic random access memory cell (DRAM cell) is typically formed in such a manner that a trench-type isolation layer is formed on a silicon substrate and an active device is formed in an active area of the silicon substrate. Typically, the active device includes a MOS transistor.

The MOS transistor includes a gate electrode layer having a stacked structure in which polysilicon and tungsten silicide are stacked on a gate oxide layer. A sidewall spacer and a mask layer act as insulators to protect the gate electrode layer. The gate electrode layer is used as a mask for ion implantation of impurities into the active area on a surface of the silicon substrate in order to form source and drain regions.

In order to form a contact of the source and drain region, a self-aligned contact technique is used to form a contact hole and the thus formed contact hole is filled with a conductive material such as polysilicon to form a contact plug. The contact plug is separately formed from the conductive material by performing a chemical mechanical polishing (CMP) process.

The MOS transistor as described above is covered with an insulation layer, a surface portion of which is planarized through implementation of the CMP process.

Then, a bit line contact is formed in the insulation layer and the drain contact plug is exposed and then, a bit line is formed. The bit line is protected by means of a sidewall spacer and a mask layer, which serve as insulators.

The bit line is covered with an insulation layer, the surface of which is also planarized through implementation of the CMP process. A cell capacitor is subsequently formed on the insulation layer.

Figure 6:
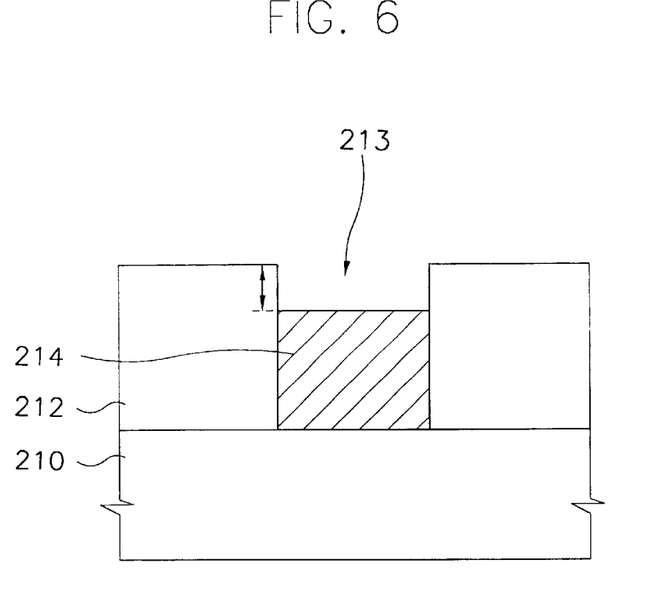
FIGS. 6 to 11 illustrate sectional views depicting stages in a process of forming the concave type of the metal-insulator-metal capacitor of the integrated circuit device according to a second embodiment of the present invention, as illustrated in FIG. 4.

Referring to FIG. 6, a cell transistor and a bit line are formed on a semiconductor substrate as described above, and then a buried contact hole 213 is formed in a first insulation layer 212 on a semiconductor substrate 210 so that the source region of the cell transistor is exposed. Next, polysilicon is deposited on the semiconductor substrate 210 to fill the buried contact hole 213. Polysilicon on the first insulation layer 212 is removed through an etching process and polysilicon in the buried contact hole is over etched to a desired depth to form a buried contact plug 214.

After polysilicon on the first insulation layer is removed by the chemical mechanical polishing process, polysilicon in the buried contact hole 213 may be removed to the desired depth by a wet etching method or a dry etching method to form the buried contact plug 214.

Figure 7:
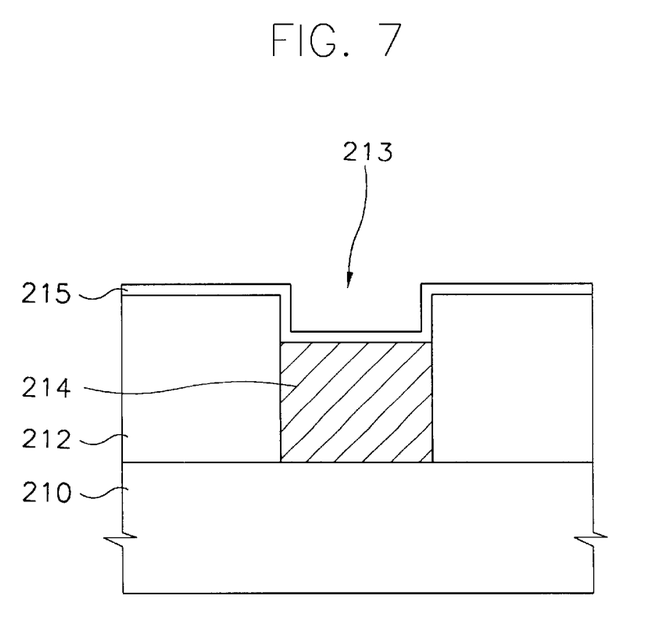

Referring to FIG. 7, when the buried contact plug 214 is formed in the buried contact hole 213, $Al_2O_3$ is deposited on the buried contact plug 214 to a thickness of 50 Å to 500 Å to form an $Al_2O_3$ layer 215.

Figure 8:
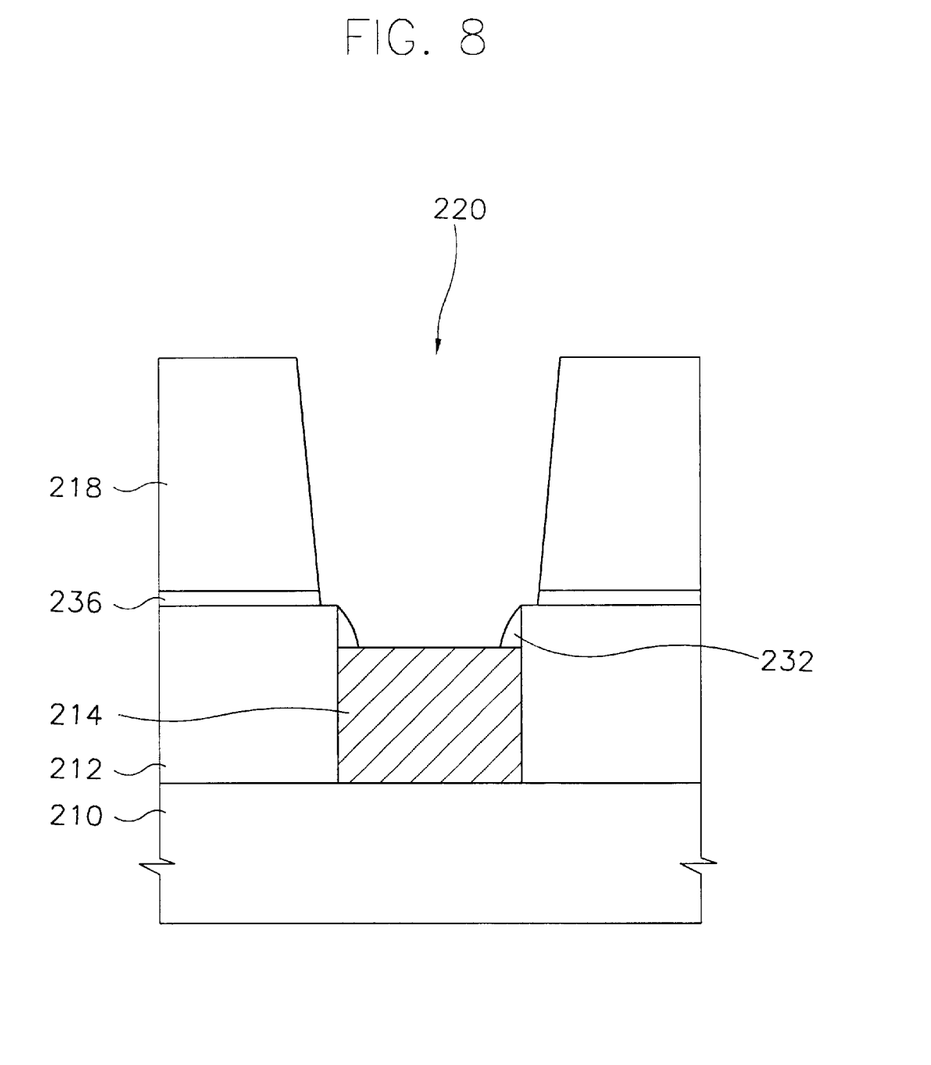

Referring to FIG. 8, a second insulation layer 218 is thickly deposited on the $Al_2O_3$ layer (215 of FIG. 8). A through hole 220 is formed in the second insulation layer 218 by a photolithography process. At this time, the $Al_2O_3$ layer 215, which is formed under the second insulation layer 218, functions as an etching stop layer of the second insulation layer 218.

When the $Al_2O_3$ layer exposed at the bottom portion of the through-hole 220 is anisotropically etched, a diffusion barrier spacer 232 remains on sidewalls of the buried contact hole 213, above the buried contact plug, as shown in FIG. 8. In addition, the $Al_2O_3$ layer remaining between the first insulation layer 212 and the second insulation layer 218 functions as a diffusion barrier layer 236.

Figure 9:
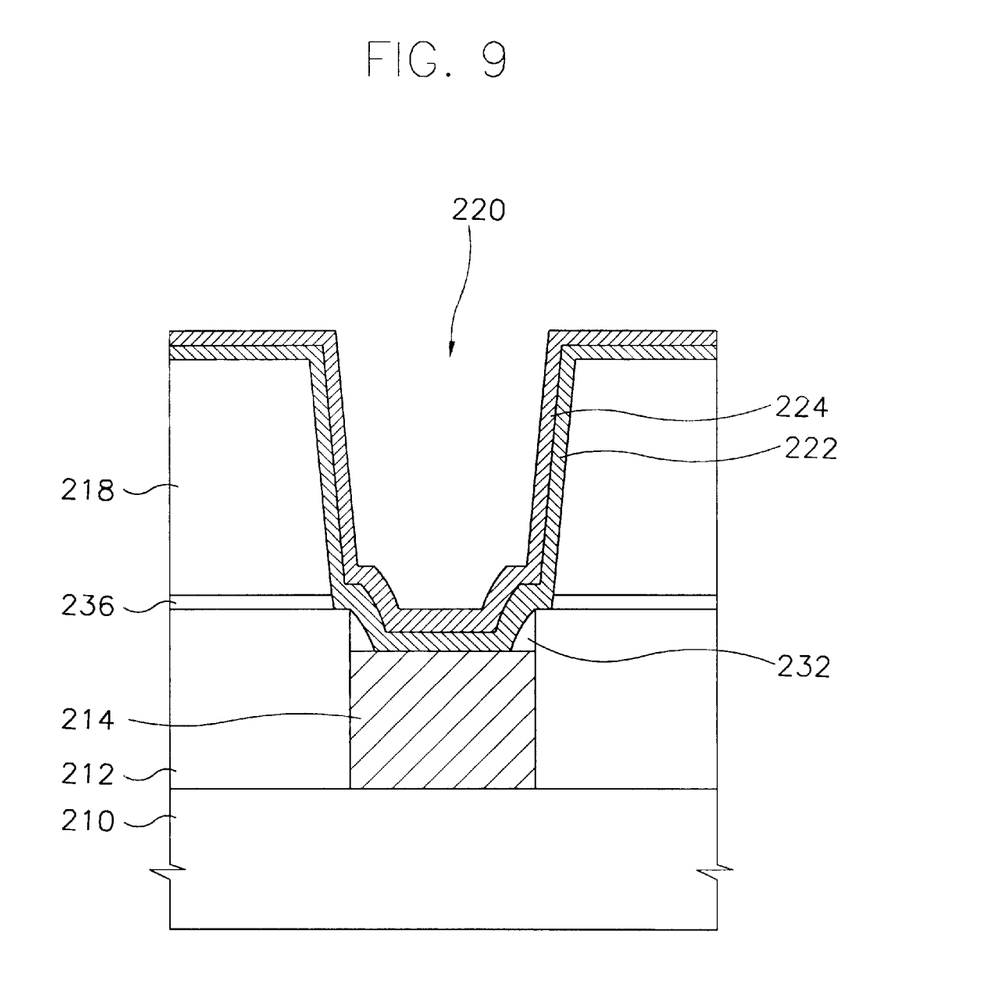

Referring to FIG. 9, a barrier layer 222 comprised of TiN, TiSiN or TaN is deposited on the buried contact plug 214 and the diffusion barrier spacer 232 to a uniform thickness. A lower electrode layer 224 is formed on the barrier layer 222 by depositing a material such as Pt, Ru, Ir, RuOx, or IrOx, or the like to a uniform thickness. These materials may be deposited alone or in a mixture thereof.

Figure 10:
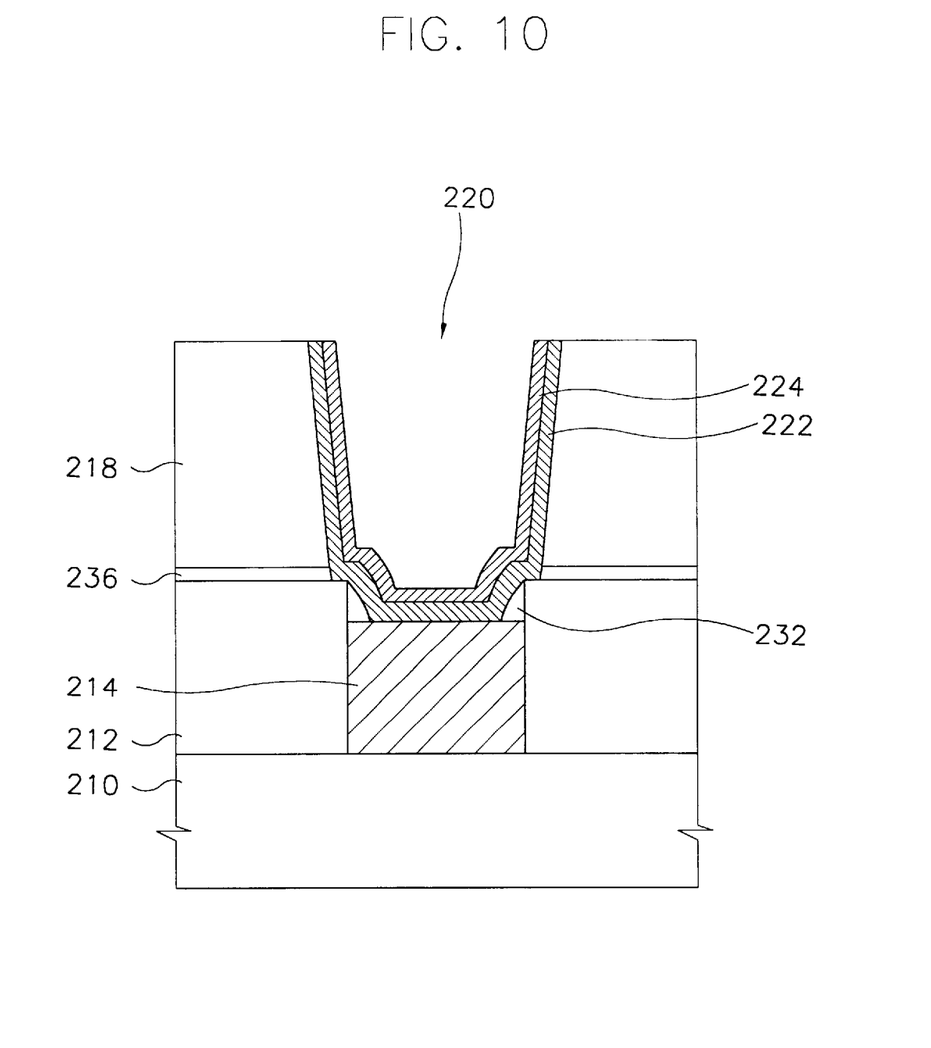

Referring to FIG. 10, the barrier layer 222 and the lower electrode layer 224 on the second insulation layer 218 are removed by a CMP process so that the barrier layer 222 and the lower electrode layer 224 are divided into a node unit. Thus, storage nodes are separated from each other.

Figure 11:
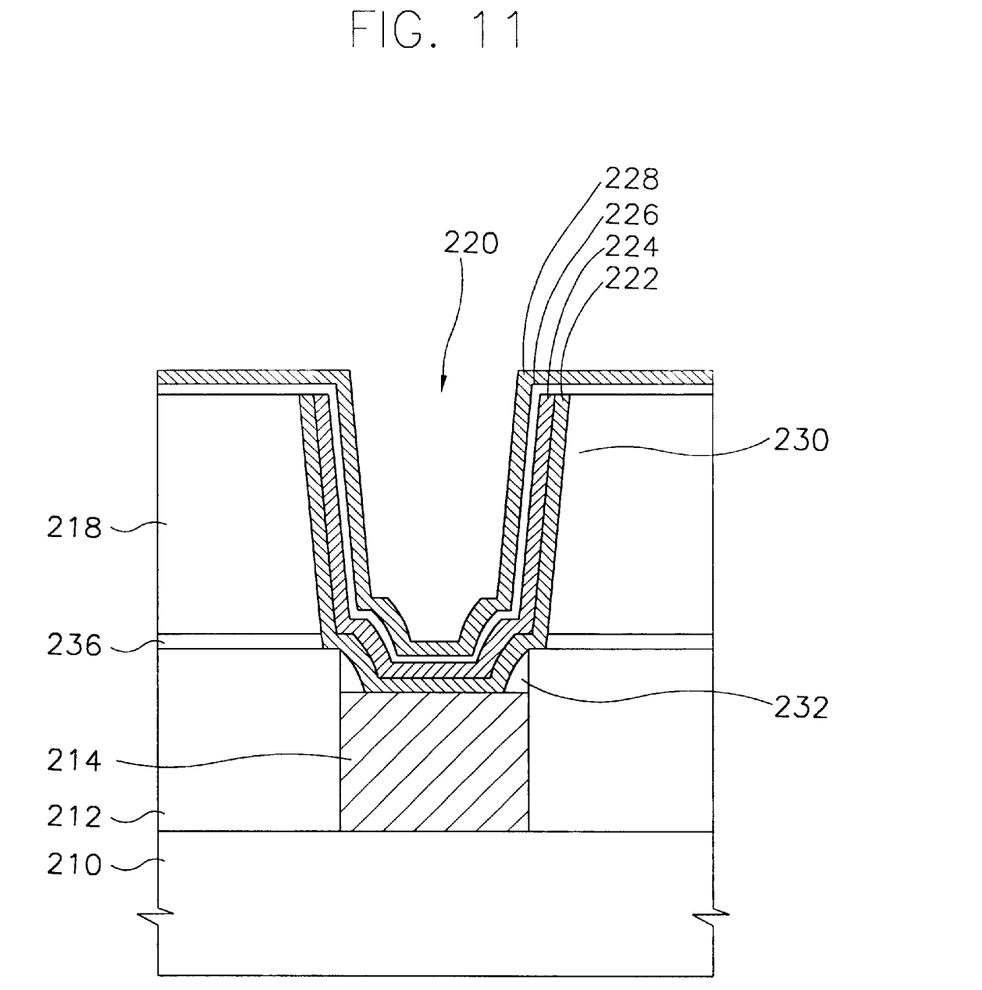

Referring to FIG. 11, a dielectric layer 226 is formed by depositing a material such as $Ta_2O_5$, TaOxNy, $Al_2O_3$, (Ba, Sr)$TiO_3$[BST], $SrTiO_3$[ST], Pb(Zi, Ti)$O_3$[PLZT], SBT, or the like, or a mixture thereof, on the lower electrode layer 224. The dielectric layer 226 is then crystallized by a heat treatment in an oxidation atmosphere such as an oxygen atmosphere.

Subsequently, an upper electrode layer 228 is formed by depositing a material such as Pt, Ru, Ir, RuOx, IrOx, or the like, or a mixture thereof on the dielectric layer 226.

In the process of forming the capacitor according to the first embodiment of the present invention as shown in FIG. 3, unlike the process of forming the capacitor of the second embodiment as described with respect to FIGS. 6–11, the diffusion barrier spacer 232 is formed by anisotropically etching the $Al_2O_3$ layer before formation of the second insulation layer 218 on the first insulation layer 212. Further, a nitride layer 235 is formed as an etching stop layer between the first insulation layer 212 and the second insulation layer 218 during formation of the through hole in the second insulation layer 218 as shown in FIG. 3.

A process for forming the convex type of the metal-insulator-metal capacitor of the integrated circuit device according to the third embodiment of the present invention will be described with reference to FIGS. 12 to 16.

Figure 12:
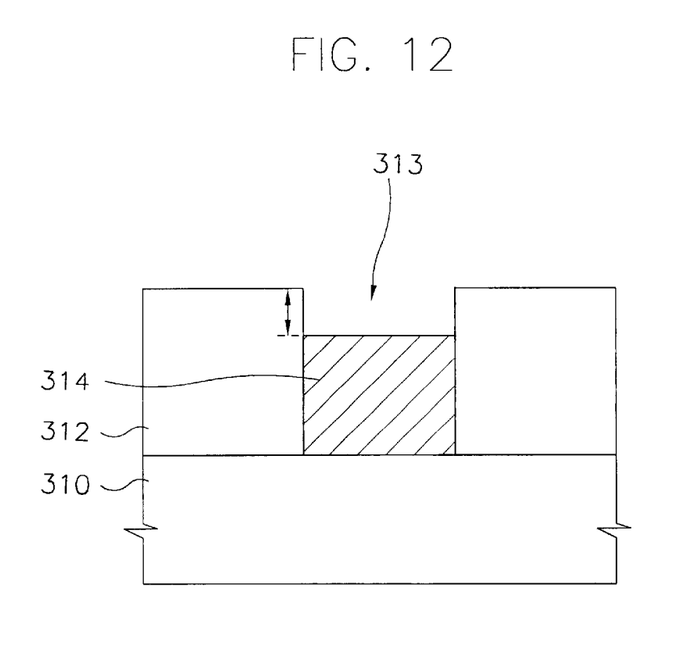
FIGS. 12 to 16 illustrate sectional views depicting stages in a process of forming the convex type of the metal-insulator-metal capacitor of the integrated circuit device according to a third embodiment of the present invention, as illustrated in FIG. 5.

Referring to FIG. 12, after a cell transistor and a bit line are formed on a semiconductor substrate 310 as described above, a buried contact hole 313 is formed in a first insulation layer 312 on the semiconductor substrate 310 to expose a source region of the cell transistor. Next, polysilicon is deposited on the semiconductor substrate 310 to partially fill the buried contact hole 313. Polysilicon on the first insulation layer 312 is removed through an etching process and polysilicon in the buried contact hole is over etched to a desired depth to form a buried contact plug 314.

Here, after polysilicon on the first insulation layer 312 is removed by a CMP process, polysilicon remaining in the buried contact hole 313 may be removed to the desired depth by a wet etching method or a dry etching method to form the buried contact plug 314.

Figure 13:
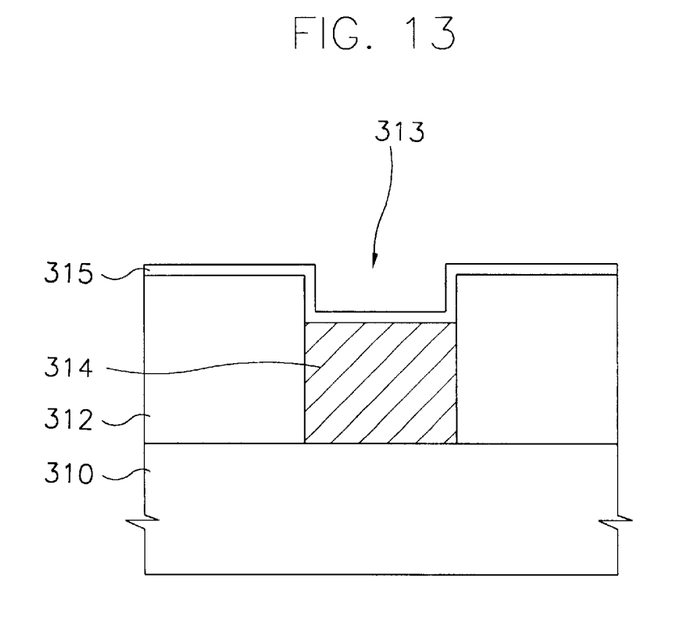

Referring to FIG. 13, when the buried contact plug 314 is formed in the buried contact hole 313, an $Al_2O_3$ layer 315 is formed on the buried contact plug 314 by depositing $Al_2O_3$ to a thickness of about 50 Å to 500 Å.

Figure 14:
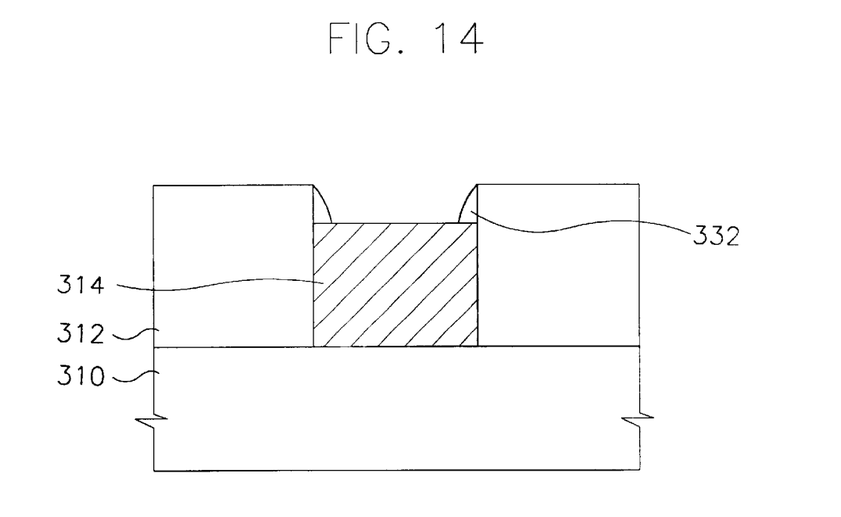

Referring to FIG. 14, the $Al_2O_3$ layer 315 is anisotropically etched so that a diffusion barrier spacer 332 remains on a sidewall of an upper portion of the buried contact hole 313, above the buried contact plug 314.

Figure 15:
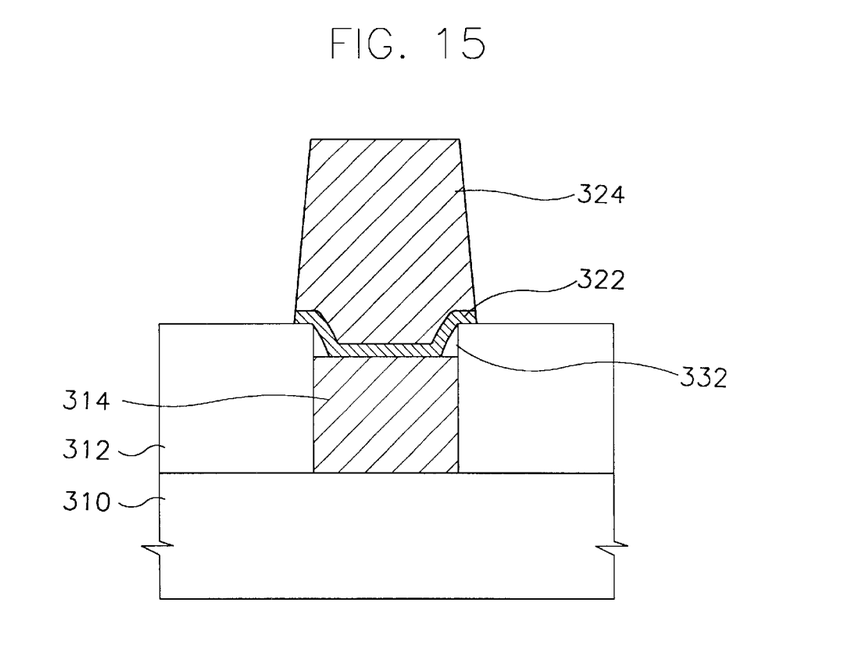

Referring to FIG. 15, a barrier layer 322 is formed by depositing TiN, TiSiN or TaN on the buried contact plug 314 and the diffusion barrier spacer 332 to a uniform thickness. A lower electrode layer 324 is formed by depositing a material such as Pt, Ru, Ir, RuOx, or IrOx, or the like, alone or in a mixture thereof, to a uniform thickness on the barrier layer 322.

The barrier layer 322 and the lower electrode layer 324 are anisotropically etched through a photolithographic process to obtain a desired pattern so that the barrier layer 322 and the lower electrode layer 324 are divided into a node unit, forming a storage node for each cell. Thus, the storage nodes are separated from each other.

Figure 16:
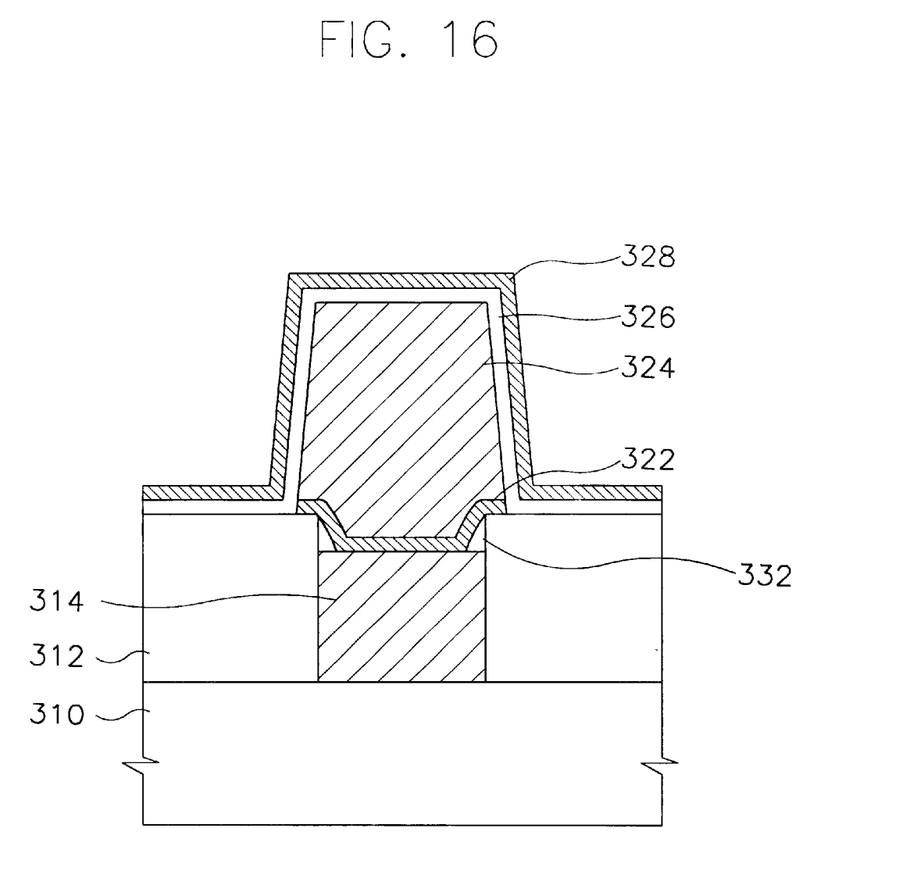

Referring to FIG. 16, a dielectric layer 326 is formed by depositing a material such as $Ta_2O_5$, TaOxNy, $Al_2O_3$, (Ba, Sr)$TiO_3$[BST], $SrTiO_3$[ST], Pb(Zi, Ti)$O_3$[PLZT], or SBT, or the like, alone or in a mixture thereof, on the lower electrode layer 324, and then crystallizing the dielectric layer by a heat treatment in an oxidation atmosphere such as an oxygen atmosphere. Subsequently, an upper electrode layer 328 is formed by depositing a material such as Pt, Ru, Ir, RuOx, or IrOx, or the like, alone or in a mixture thereof, on the dielectric layer 326.

In the present invention as described above, a portion of a buried contact plug is removed and a diffusion barrier spacer is formed on an inner side surface of an upper portion of a buried contact hole above the buried contact plug. As a result, diffusion of oxygen along a boundary surface of the barrier layer to the contact plug may be prevented.

Accordingly, reliability of the capacitor of the integrated circuit device is improved by preventing oxidation of the contact plug. Furthermore, capacitance of the capacitor is increased as an effective surface area of the capacitor extends to the inside of the buried contact hole.

Preferred embodiments of the present invention have been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of manufacturing a capacitor of an integrated circuit device comprising:

forming a first insulation layer on a semiconductor substrate;

forming a buried contact hole in the first insulation layer;

forming a buried contact plug in the buried contact hole to fill a portion of the buried contact hole;

forming a diffusion barrier layer on the first insulation layer, on the buried contact plug and on an inner side surface of an upper portion of the buried contact hole above the buried contact plug, the diffusion barrier layer having a uniform thickness along a surface profile of the buried contact hole;

forming a second insulation layer on the diffusion barrier layer;

etching the second insulation layer and the diffusion barrier layer to form a through hole to expose a top surface of the buried contact plug and a diffusion barrier spacer on an inner side surface of the upper portion of the buried contact hole, the through hole having a diameter that is larger than that of the buried contact hole;

forming a barrier layer on a bottom and a side surface of the through hole along a surface profile of the through hole;

forming a lower electrode on the barrier layer;

forming a dielectric layer on the lower electrode and an upper surface of the second insulation layer;

heat treating the dielectric layer in an oxygen atmosphere to crystallize the dielectric layer; and forming an upper electrode on the dielectric layer.

2. The method of manufacturing a capacitor of an integrated circuit device as claimed in claim 1, wherein the barrier layer is uniformly formed to a predetermined thickness.

3. The method of manufacturing a capacitor of an integrated circuit device as claimed in claim 1, wherein the lower electrode is uniformly formed to a predetermined thickness.

4. The method of manufacturing a capacitor of an integrated circuit device as claimed in claim 1, wherein the dielectric layer is uniformly formed to a predetermined thickness.

5. The method of manufacturing a capacitor of an integrated circuit device as claimed in claim 1, wherein the upper electrode is uniformly formed to a predetermined thickness.

6. The method of manufacturing a capacitor of an integrated circuit device as claimed in claim 1, wherein the diffusion barrier layer is comprised of $Al_2O_3$.

7. The method of manufacturing a capacitor of an integrated circuit device as claimed in claim 1, wherein the barrier layer and the lower electrode are polished by a chemical mechanical polishing (CMP) process so that the barrier layer and the lower electrode are divided into a node unit.

* * * * *